(12) United States Patent
Lombardi et al.

(10) Patent No.: US 7,409,192 B2
(45) Date of Patent: Aug. 5, 2008

(54) METHOD AND APPARATUS FOR FREQUENCY SYNTHESIS IN DIRECT-CONVERSION TRANSMITTERS

(75) Inventors: Frank Lombardi, Durham, NC (US); John G. Freed, Raleigh, NC (US); Martin Isberg, Lund (SE)

(73) Assignee: Telefonaktiebolaget LM Ericsson (publ) (SE)

( * ) Notice: Subject to any disclaimer, the term of this patent is extended or adjusted under 35 U.S.C. 154(b) by 560 days.

(21) Appl. No.: 11/186,380

(22) Filed: Jul. 21, 2005

(65) Prior Publication Data

US 2007/0019109 A1    Jan. 25, 2007

(51) Int. Cl.
    *H04B 1/04* (2006.01)
(52) U.S. Cl. ...................................... 455/112; 455/118
(58) Field of Classification Search .................. None
    See application file for complete search history.

(56) References Cited

U.S. PATENT DOCUMENTS

| | | | | |
|---|---|---|---|---|
| 4,293,825 | A | * | 10/1981 | Cerra .............................. 331/2 |
| 6,008,704 | A | * | 12/1999 | Opsahl et al. ................ 455/112 |
| 6,115,586 | A | | 9/2000 | Bezzam et al. |
| 6,321,074 | B1 | | 11/2001 | Lemay |
| 6,484,038 | B1 | | 11/2002 | Gore et al. |
| 6,782,249 | B1 | | 8/2004 | Feldman |
| 6,850,749 | B2 | | 2/2005 | Soorapanth et al. |
| 2002/0077066 | A1 | | 6/2002 | Pehike et al. |
| 2003/0050029 | A1 | | 3/2003 | Kaufmann et al. |
| 2003/0087613 | A1 | * | 5/2003 | Bellaouar et al. ............. 455/91 |
| 2003/0169827 | A1 | | 9/2003 | Shi et al. |
| 2005/0032486 | A1 | | 2/2005 | Malone et al. |
| 2005/0036566 | A1 | | 2/2005 | Eikenbroek et al. |
| 2005/0135502 | A1 | | 6/2005 | Zhang et al. |

FOREIGN PATENT DOCUMENTS

| | | |
|---|---|---|
| GB | 2350948 | 12/2000 |
| WO | WO 99/33178 | 7/1999 |
| WO | WO 02/37666 | 5/2002 |

(Continued)

OTHER PUBLICATIONS

Chien, "Low-Noise Local Oscillator Design Techniques Using a DLL-Based Frequency Multiplier for Wireless Applications", University of California, Berkely, 2000.

(Continued)

*Primary Examiner*—Thanh Cong Le
(74) *Attorney, Agent, or Firm*—Coats & Bennett, P.L.L.C.

(57) ABSTRACT

A method and apparatus for direct-conversion transmission generates a first frequency signal that is non-harmonically related to a transmit frequency signal, divides the first frequency signal to obtain a mixing frequency signal, divides the first frequency signal to obtain an intermediate frequency reference signal, generates the transmit frequency signal by using the mixing frequency signal to downconvert the transmit frequency signal into an intermediate frequency feedback signal, and phase-locks the intermediate frequency feedback signal to the intermediate frequency reference signal. The transmit frequency signal may be phase modulated, and may serve as an input to a saturated-mode power amplifier that can be configured for corresponding amplitude modulation. Alternatively, the un-modulated transmit frequency signal serves as the carrier signal input to a quadrature modulator, which imparts I/Q modulations to it, thereby producing a modulated carrier signal for input to a linear power amplifier.

21 Claims, 5 Drawing Sheets

FOREIGN PATENT DOCUMENTS

| WO | WO 02/067413 A2 | 8/2002 |
|---|---|---|
| WO | WO 02/067413 A3 | 8/2002 |
| WO | WO 2004/023667 | 3/2004 |
| WO | WO 2004/036750 | 4/2004 |
| WO | WO 2004/038909 | 5/2004 |
| WO | WO 2004/040872 | 5/2004 |
| WO | WO 2005/015759 | 2/2005 |

OTHER PUBLICATIONS

Craninckx et al., "A Harmonic Quadrature LO Generator Using a 90° Delay-Locked Loop", IEEE, 2004. pp. 127-130.

Razavi, "Topics in Circuits for Communications: RF CMOS Transceivers for Cellular Telephony", IEEE Communications Magazine, Aug. 2003, pp. 144-149.

Simon et al., "A CMOS Quad-Band-ΣΔ-Transceiver for GSM-Edge with Dual Mode Transmitter Architecture for Low Noise and High Linearity", IEEE Radio Frequency Integrated Circuits Symposium, 2004, pp. 431-434.

Thomann et al., "A Single-Chip 75 GHz/0.35-μm SiGe BiCMOS W-CDMA Homodyne Transceiver for UMTS Mobiles", IEEE Radio Frequency Integrated Circuits Symposium, 2004, pp. 69-72.

Koh et al., "Subharmonically Pumped CMOS Frequency Conversion (Up and Down) Circuits for 2-GHz WCDMA Direct-Conversion Transceiver", IEEE Journal of Solid-State Circuits, vol. 39, No. 6, 2004, pp. 871-884.

Zhang et al., "A 5-GHz Direct-Conversion CMOS Transceiver", IEEE Journal of Solid-State Circuits, vol. 38, No. 12, 2003, pp. 2232-2238.

Loke et al., "Direct Conversion Radio for Digital Mobile Phones—Design Issues, Status, and Trends", IEEE Transactions on Microwave Theory and Techniques, vol. 50, No. 11, 2002, pp. 2422-2435.

Stetzler et al., "GSM Transceiver RF Integrated Circuit", IEEE International Solid State Circuits Conference, 1995, pp. 150-152.

Mehta, "Transceiver Architectures for Wireless ICs", RF Mixed Signal, Feb. 2001, pp. 76-96.

"Reduced Filter Requirements Using an Ultra Low Noise Modulator", Microwave Journal, Horizon House Publications, Inc., Jan. 2001.

Razavi, "A Study of Injection Locking and Pulling in Oscillators", IEEE Journal of Solid-State Circuits, vol. 39, No. 9, 2004, pp. 1415-1424.

Rudell et al., "Recent Developments in High Integration Multi-Standard CMOS Transceivers for Personal Communication Systems", Department of Electrical Engineering and Computer Sciences, University of California, Berkeley.

Weldon et al., "Transmitter with Harmonic-Rejection Mixers", IEEE International Solid-State Circuits Conference, 2001.

Guillou et al., "Highly Integrated Direct Conversion Receiver for GSM/GPRS/Edge With On-Chip 84-dB Dynamic Range Continuous-Time ΣΔ ADC", IEEE Journal of Solid-State Circuits, vol. 40, No. 2, 2005, pp. 403-411.

* cited by examiner

850 MHz TRANSMIT FREQUENCY PLAN

| TX Freq (MHz) | M | N | Loop Multiplier (224/52) | VCO Freq (MHz) | Φ-Detector (MHz) |
|---|---|---|---|---|---|
| 848.8 | 4 | 56 | 4.307692308 | 3656.369231 | 65.29230769 |
| 836 | 4 | 56 | 4.307692308 | 3601.230769 | 64.30769231 |
| 824.2 | 4 | 56 | 4.307692308 | 3550.4 | 63.4 |

*FIG. 5*

900 MHz TRANSMIT FREQUENCY PLAN

| TX Freq (MHz) | M | N | Loop Multiplier (224/52) | VCO Freq (MHz) | Φ-Detector (MHz) |
|---|---|---|---|---|---|
| 914.8 | 4 | 56 | 4.307692308 | 3940.676923 | 70.36923077 |
| 897.4 | 4 | 56 | 4.307692308 | 3865.723077 | 69.03076923 |
| 880.2 | 4 | 56 | 4.307692308 | 3791.630769 | 67.70769231 |

*FIG. 6*

1800 MHz TRANSMIT FREQUENCY PLAN

| TX Freq (MHz) | M | N | Loop Multiplier (112/54) | VCO Freq (MHz) | Φ-Detector (MHz) |
|---|---|---|---|---|---|
| 1784.8 | 2 | 56 | 2.074074074 | 3701.807407 | 66.1037037 |
| 1747.4 | 2 | 56 | 2.074074074 | 3624.237037 | 64.71851852 |
| 1710.2 | 2 | 56 | 2.074074074 | 3547.081481 | 63.34074074 |

*FIG. 7*

1900 MHz TRANSMIT FREQUENCY PLAN

| TX Freq (MHz) | M | N | Loop Multiplier (112/54) | VCO Freq (MHz) | Φ-Detector (MHz) |
|---|---|---|---|---|---|
| 1909.8 | 2 | 56 | 2.074074074 | 3961.066667 | 70.73333333 |
| 1880 | 2 | 56 | 2.074074074 | 3899.259259 | 69.62962963 |
| 1850.2 | 2 | 56 | 2.074074074 | 3837.451852 | 68.52592593 |

*FIG. 8*

METHOD AND APPARATUS FOR FREQUENCY SYNTHESIS IN DIRECT-CONVERSION TRANSMITTERS

BACKGROUND

The present invention is generally related to wireless communications, and is particularly related to transmit frequency signal generation.

In "direct conversion" transmitters, transmitter modulation and frequency up-conversion generally occur in the same circuit, which means that the transmitted carrier frequency signal is the same as the local oscillator (LO) frequency. While this approach offers economic advantages in terms of circuit simplification and reduced component count, it poses certain design challenges.

For example, the loop bandwidth of the direct-conversion frequency synthesizer generally should be kept relatively narrow in the interest of suppressing sideband phase noise for good Adjacent Channel Power (ACP) suppression performance. However, the relatively low power, high tuning sensitivity Voltage Control Oscillators (VCOs) used in such frequency synthesis loops are prone to frequency pulling, wherein they are disturbed by the modulations of the relatively high-power transmit signal.

Increasing the loop bandwidth of the frequency synthesizer improves its resistance to pulling, but decreases its ability to suppress sideband phase noise. As such, improving pulling resistance and ACP noise performance represent competing design challenges that are difficult to reconcile in single-loop direct-conversion architectures. "Two-step" transmitter architectures may be used to reconcile the above conflict between pulling resistance and ACP performance, by up-converting the base band information signal to be transmitted using two frequency conversion steps, so that the power amplifier output spectrum is relatively far away from the VCO operating frequencies.

However, as a general proposition, the second up-conversion step generates unwanted sidebands and spurious frequencies that must be significantly suppressed using a relatively expensive high-Q filter. Because such filters are difficult to integrate on-chip in high-density circuits, the two-step conversion process ordinarily necessitates the use of off-chip filters, adding to circuit expense and size.

Further, it is known to use a translational loop architecture to mitigate VCO injection pulling issues, wherein a main phase locked loop operates as a primary LO frequency to a frequency mixer in the translational loop and a secondary LO frequency is applied to the translational loop's phase detector to enable phase comparison with the translated signal. However, an additional VCO and phase locked loop circuitry (e.g., phase detector, programmable frequency dividers, loop filter) generally are necessary to generate the second LO frequency to obtain the necessary offset (intermediate) frequencies, which adds to the cost and size of the design.

SUMMARY OF THE DISCLOSURE

According to one embodiment of transmit frequency synthesis as taught herein, a transmitter circuit comprises a first phase-locked loop (PLL) configured to generate a first frequency signal that is non-harmonically related to a transmit frequency signal, a first frequency divider configured to divide the first frequency signal to generate a mixing frequency signal for down converting the transmit frequency signal into an intermediate frequency feedback signal, a second frequency divider configured to generate an intermediate frequency reference signal by dividing the first frequency signal, and a second PLL configured to generate the transmit frequency signal by phase-locking the intermediate frequency feedback signal to the intermediate frequency reference signal. This transmit frequency generation architecture offers a number of economic and performance advantages.

For example, use of the second PLL as a translational PLL allows the main VCO (in the first PLL) to be non-harmonically related to the transmit frequency, which means that the main VCO is not pulled by the high-power output signal generated at the transmit frequency. Because the first PLL is not prone to pulling, its loop bandwidth may be set narrow relative to the desired transmit frequency channel spacing, such that it exhibits very low phase noise and exemplary Adjacent Channel Power (ACP) suppression. Conversely, the loop bandwidth of the second PLL can be set wide relative to the loop bandwidth of the first PLL, such that the second PLL exhibits very good resistance to VCO pulling effects. Additionally, use of the first and second frequency dividers allows for flexible selection of the desired mixing frequency to produce the intermediate frequency feedback signal and provides the ability to conveniently and economically obtain the appropriate intermediate frequency reference signal.

More particularly, use of the first and second frequency dividers allows an associated transmitter circuit to store one or more divisor values, or pairs of divisor values, corresponding to a frequency plan that implements any number of desired transmit frequency bands and transmit frequency channels. By selecting divisor values for at least one of the first and second frequency dividers, and by programming the first PLL, which may be configured as a main channel synthesizer, the transmit frequency may be conveniently set to a desired value without the need for additional LO circuitry (including VCOs, phase detectors, and loop filters).

With the above flexibility and economy in mind, one embodiment of a transmitter as taught herein provides a quadrature (I/Q) modulator that is driven by the transmit frequency signal output by the aforementioned second PLL. The I/Q modulator generates a modulated carrier signal by modulating the transmit frequency signal responsive to I/Q modulation signals, and a linear power amplifier is configured to generate an (RF) output signal by amplifying the modulated carrier signal. This arrangement provides a high performance and economical transmitter architecture for wireless communication applications, such as Wideband CDMA (W-CDMA), GSM, EDGE, WLAN, Bluetooth, etc.

In other embodiments, a transmit circuit may be configured for polar modulation (sometimes referred to as "Envelope Elimination and Restoration"). In such embodiments, the phase modulator is configured to impart desired phase modulations to the transmit frequency signal by phase-modulating the first frequency signal responsive to a phase modulation signal by inserting a phase modulator in the mixing frequency signal path (either before or after first frequency divider) or by inserting a phase modulator in the intermediate frequency reference signal path (either before or after second frequency divider). In this context, a saturated-mode power amplifier may be configured to impart desired amplitude modulations to the output signal by amplitude-modulating a power supply signal of the saturated-mode power amplifier.

Of course, the present invention is not limited to the above features and advantages. Those skilled in the art will recognize additional features and advantages upon reading the following detailed discussion and upon viewing the accompanying drawings.

BRIEF DESCRIPTION OF THE DRAWINGS

FIGS. 5-8 are frequency planning tables that include exemplary divisor values for the first and second frequency dividers of the transmit circuit shown in FIG. 1, having values based on a number of different transmit frequency bands and desired transmit frequency channels.

DESCRIPTION OF EMBODIMENTS OF THE INVENTION

Figures 1, 2:
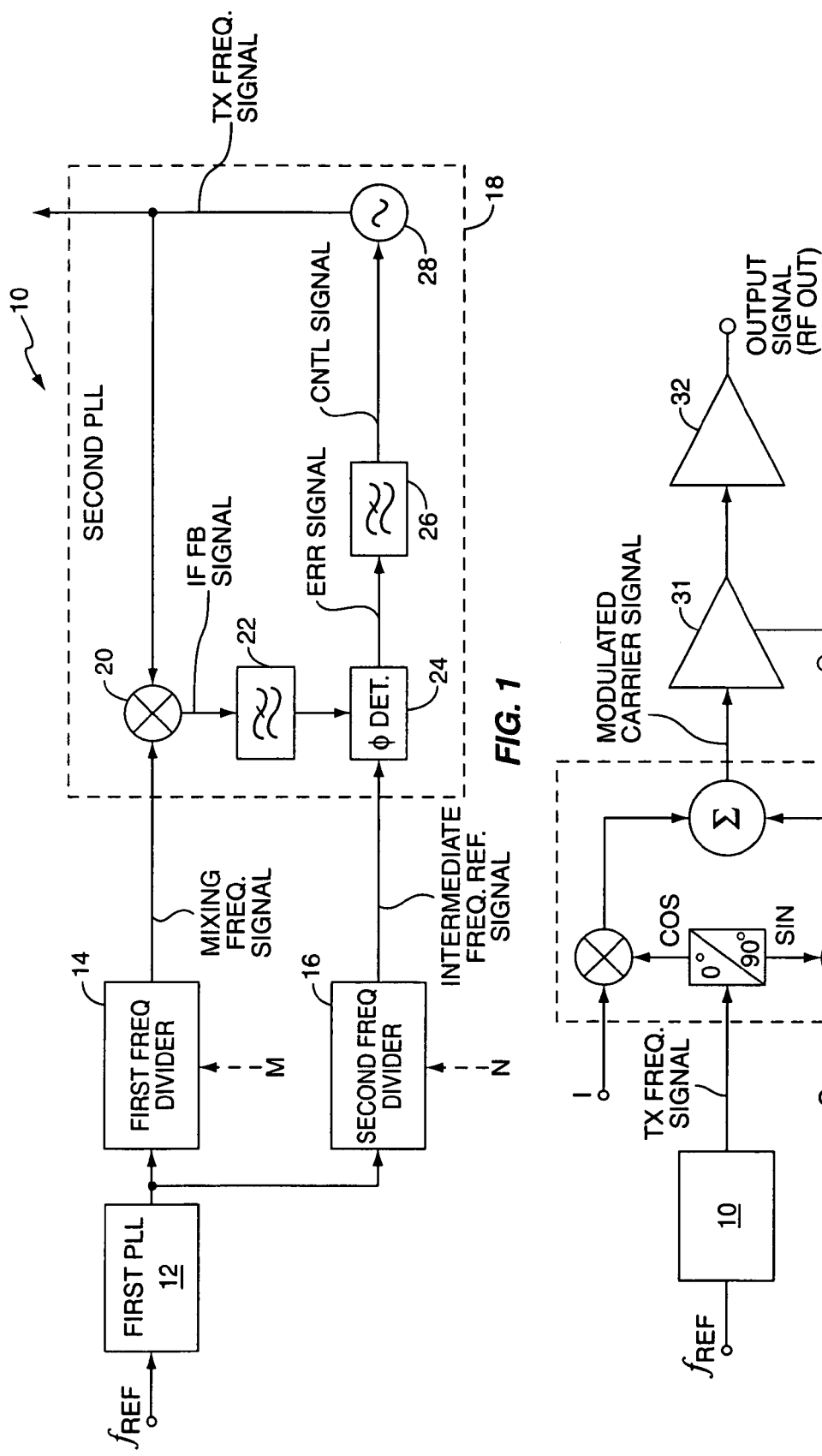
FIG. 1 is a block diagram of a transmit circuit configured to generate a desired transmit frequency signal using a first phase-locked loop (PLL), first and second frequency dividers, and a second PLL.
FIG. 2 is an embodiment of the transmit circuit of FIG. 1, shown in association with a quadrature modulator and a linear power amplifier.

FIG. 1 illustrates an embodiment of a transmit circuit 10 comprising a first phase-locked loop (PLL) 12, first and second frequency dividers 14 and 16, and a second PLL 18. In the illustrated embodiment, the second PLL 18 is configured as a translational PLL and includes a mixer 20, an optional filter 22, a phase detector 24, a loop filter 26, and a Voltage Controlled Oscillator (VCO) 28.

The first PLL 12 is configured as a main channel synthesizer, and generates a first frequency signal that is non-harmonically related to the transmit frequency signal output by the second PLL 18. More particularly, the first PLL 12 derives a first frequency signal from a reference frequency signal ($f_{REF}$). The first frequency divider 14 divides the first frequency signal according to a divisor value "M" to produce a desired mixing frequency signal. The second frequency divider 16 divides the first frequency signal according to a second divisor value "N" to generate an intermediate frequency reference signal.

In turn, the second PLL 18 uses the mixing frequency signal in its mixer 20 to down convert the transmit frequency signal to an intermediate frequency feedback signal. An optional filter 22 may be used to filter the intermediate frequency feedback signal, which is provided to the phase detector 24. The phase detector 24 generates an error signal based on phase-comparing the intermediate frequency feedback signal (or the filtered version of that signal) to the intermediate frequency reference signal as output by the second frequency divider 16. The loop filter 26 generates an output control signal based on filtering the error signal, and that control signal serves as the frequency control adjustment input of the VCO 28. Thus, the transmit frequency signal is generated under closed-loop control based on phase-locking the intermediate frequency feedback signal to the intermediate frequency reference signal.

With appropriate selection of the divisor values M and N, the first PLL 12 can be configured to generate the first frequency signal as a non-harmonic of the transmit frequency signal, meaning that the first PLL 12 is not prone to pulling effects at the transmit frequency. Because the first PLL 12 is not prone to such pulling effects, its loop bandwidth may be narrowed to improve its phase noise performance. Specifically, the loop bandwidth of the first PLL 12 may be made narrow relative to the desired transmit frequency channel spacing, such that the first frequency signal has significantly suppressed sideband noise, which improves the ACP suppression of the transmit circuit 10.

Further, the second PLL 18 can be "tuned" independently from the first PLL 12, to improve its performance. For example, the loop bandwidth of the second PLL 18 may be made wide relative to the loop bandwidth of the first PLL 12. More particularly, the loop bandwidth of the second PLL 18 may be made wide enough to resist frequency pulling effects at the transmit frequency. For transmit frequencies associated with the GSM and EDGE communications standards, a loop bandwidth for the second PLL 18 of 1.5 MHz offers good pulling resistance.

Avoiding the use of any frequency divider circuits in the feedback control loop of the second PLL 18 further enhances its performance. That is, the second PLL 18 obtains the intermediate frequency feedback signal via frequency translation in the mixer 20, rather than by dividing down the transmit frequency signal. This use of frequency translation in the feedback loop, rather than frequency division, eliminates a major source of phase noise in the transmit frequency signal output by the VCO 28.

Indeed, the phase noise of the transmit frequency signal in the illustrated architecture primarily is a function of the phase noise in the first PLL 12, which may be made quite low through the use of a relatively narrow loop bandwidth in this architecture. Use of the first frequency divider 14 and second frequency divider 16 yields further reductions in the phase noise of the transmit frequency signal based on its tendency to reduce the phase noise in the mixing frequency signal and intermediate frequency reference signal relative to the first PLL 12.

FIG. 2 extends the transmit circuit 10 of FIG. 1 by adding a quadrature modulator 30 that is configured to generate a modulated carrier signal by modulating the transmit frequency signal responsive to I/Q modulation signals. A variable-gain driver amplifier 31 may be used to provide dynamic range control for a linear power amplifier 32, such that two amplifiers are configured to generate an output signal (RF_OUT) by amplifying the modulated carrier signal. Such an arrangement ideally supports a variety of digital modulation formats that require linear amplification, or that benefit from linear amplifier operation. W-CDMA transmission is a non-limiting example of a linear amplification application.

Figure 3:
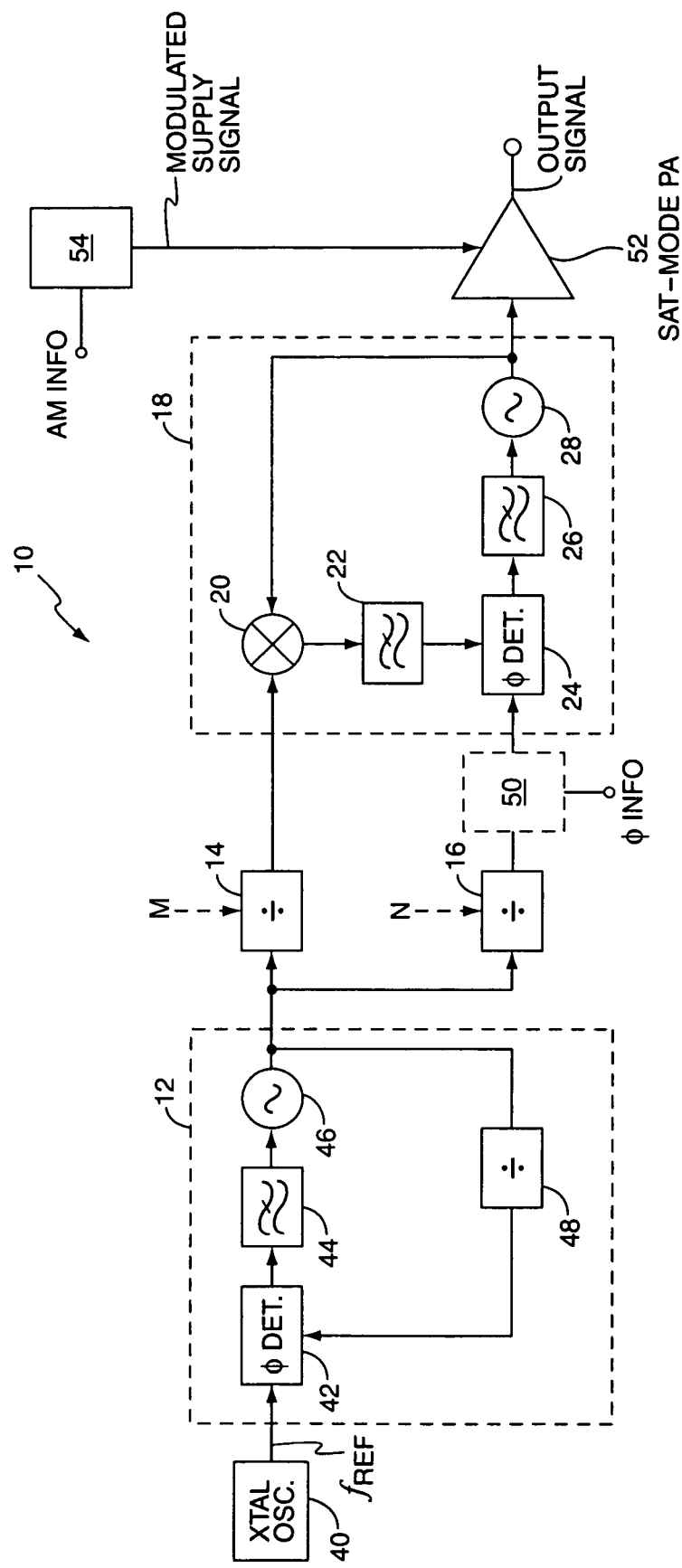
FIG. 3 is a block diagram of a polar-modulation embodiment of the transmit circuit of FIG. 1, shown in association with a saturated-mode power amplifier and corresponding phase and amplitude modulators.

Conversely, FIG. 3 illustrates an embodiment of the transmit circuit 10 that is configured for polar modulation, which is sometimes referred to as Envelope Elimination and Restoration modulation. In polar modulation, the (RF) output signal includes both phase and amplitude modulation, but such modulations are applied through different circuit paths. In looking at the phase and amplitude modulation circuit paths in more detail, one sees that the illustrated embodiment of the first PLL 12 receives a reference frequency signal from a crystal oscillator circuit 40. Additionally one sees that the first PLL 12 is configured as a PLL comprising a phase detector 42, a loop filter 44, a VCO 46, and a feedback divider circuit 48, which may be configured as a fractional-N divider.

A phase modulator 50 imparts desired phase modulations to the transmit frequency signal responsive to a phase modulation signal ($\phi_{INFO}$). The phase modulator 50 may be positioned in the mixing frequency signal path (either before or after first frequency divider 14) or the phase modulator 50 may be positioned in the intermediate frequency reference signal path (either before or after second frequency divider 16). The illustration depicts the phase modulator 50 positioned in the intermediate frequency path, after the second frequency divider 16. In either case, the transmit frequency signal generated by the VCO 28 of the second PLL 18 includes corresponding phase modulations. Thus, the transmit frequency signal output by the VCO 28 serves as a constant-envelope phase-modulated signal input to a saturated-mode power amplifier (PA) 52 that is configured to generate the RF output signal by amplifying that phase-modulated transmit frequency signal.

The illustrated circuit further includes an amplitude modulator 54 that is configured to impart desired amplitude modulations to the output signal from the PA 52 by amplitude-modulating a power supply signal of the PA 52. Such modulations may include supply voltage modulations, supply current modulations, or a combination of supply voltage and current modulations.

Regardless, one sees that the loop frequency bandwidth of the first PLL 12 may be independently tuned relative to the loop frequency bandwidth of the second PLL 18. As noted, it may be desirable to impose a relatively narrow bandwidth on the first PLL 12, such that the first frequency signal output from it has low phase noise. Additional performance improvements may be obtained by configuring the loop filter 26 of the second PLL 18 to have a relatively wide bandwidth, to resist VCO pulling effects by the modulated output signal, which is at the same frequency as the VCO 28.

In further embodiments, the transmit circuit 10 may be paired with a power amplifier circuit that is adaptable to both linear and saturated-mode modulation, including polar modulation, such that the circuit 10 is adaptable to a wide variety of modulation formats. Alternatively, the same flexibility may be obtained by configuring the transmit circuit 10 such that it selectively phase-modulates its output transmit frequency signal, with the output transmit frequency signal selectively steered to a saturated-mode amplifier for some modulation formats, and selectively steered to a linear-mode amplifier for other modulation formats.

Figure 4:
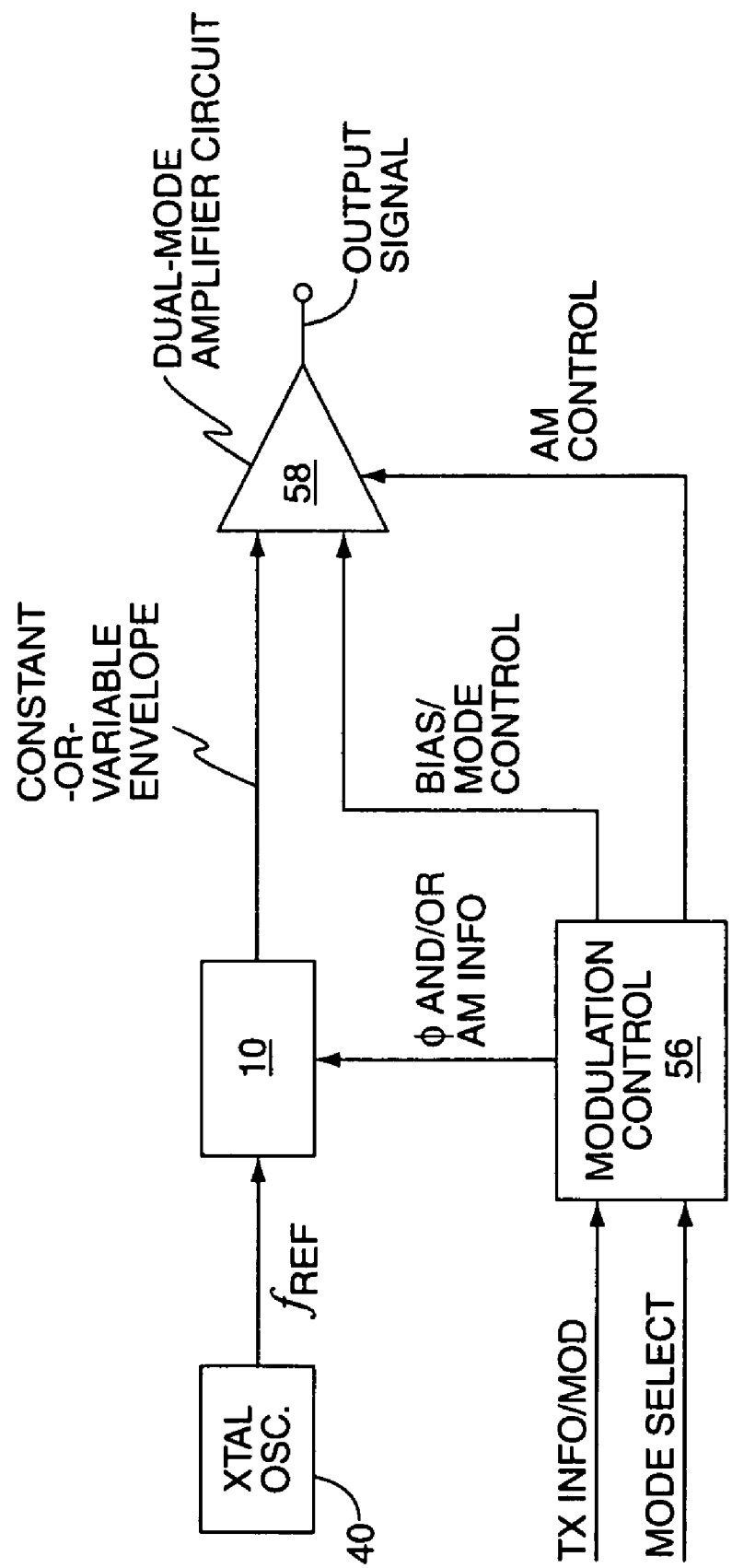
FIG. 4 is a block diagram of a dual-mode (linear mode or saturated-mode) embodiment of the transmit circuit of FIG. 1, shown in association with a modulation mode controller and dual-mode amplifier circuitry.

FIG. 4, for example, illustrates a dual-mode embodiment, wherein the transmit circuit 10 operates in response to a modulation control circuit 56, which controls whether the transmit circuit 10 provides the modulated carrier signal to a dual-mode amplifier circuit 58 as a constant-envelope signal for saturated-mode amplification, or as a variable-envelope (i.e., amplitude-modulated signal) for linear-mode amplification. As such, the dual-mode amplifier circuit 58 generally includes amplifier circuits operative in linear amplification modes and in saturated amplification modes. A bias/mode control signal from the modulation control circuit 56 may be used to select the operating mode of the dual-mode amplifier circuit 58, or other means of mode selection may be used.

With the above arrangement, a baseband controller (not shown) provides the modulation control circuit 56 with transmit information (e.g., data bits) and/or provides it with transmit modulation waveforms. In turn, depending on the state of a mode select input signal, or on some other mode indicator, the modulation control circuit 56 provides the transmit circuit 10 with phase modulation information for saturated-mode operation of the dual-mode amplifier circuit 58, and provides the transmit circuit 10 with phase and amplitude modulation information for linear-mode operation of the dual-mode amplifier circuit 58. Of course, those skilled in the art will recognize that these circuits and control arrangements represent a non-limiting example, and other methods may be used to adapt the transmit frequency circuit 10 to a wide variety of applications.

Further enhancing the transmit circuit's adaptability, the first and second frequency dividers 14 and 16 enable system designers to implement one or more frequency plans that allow the use of a "walking intermediate frequency" based on changing any of the divisor values used by the first and second frequency dividers 14 and 16 and the frequency divider 48 used in the first PLL 12, as a function of the desired transmit frequency, which may be defined by a transmit frequency band selection and a transmit frequency channel selection. That is, the use of frequency dividers between the first PLL 12 and the second PLL 18 allows the convenient selection of different intermediate frequencies supporting different desired transmit frequencies. For example, FIG. 5 illustrates divisor values corresponding to three different transmit channel frequencies in the 850 MHz transmit frequency band. FIGS. 6-8 similarly illustrate transmit frequency plans for 900 MHz (E-GSM), 1800 MHz (DCS), and 1900 MHz (PCS) transmit frequency bands.

With the adjustable divisor values illustrated in FIGS. 5-8, or with other divisor values calculated as needed for specific design implementations, the transmit circuit 10 is adaptable to a wide range of communication standards and operating frequency bands, making it an ideal candidate for use in a wireless communication device intended to operate in accordance with any one of several communication standards. Such a device is illustrated in FIG. 9.

Figure 9:
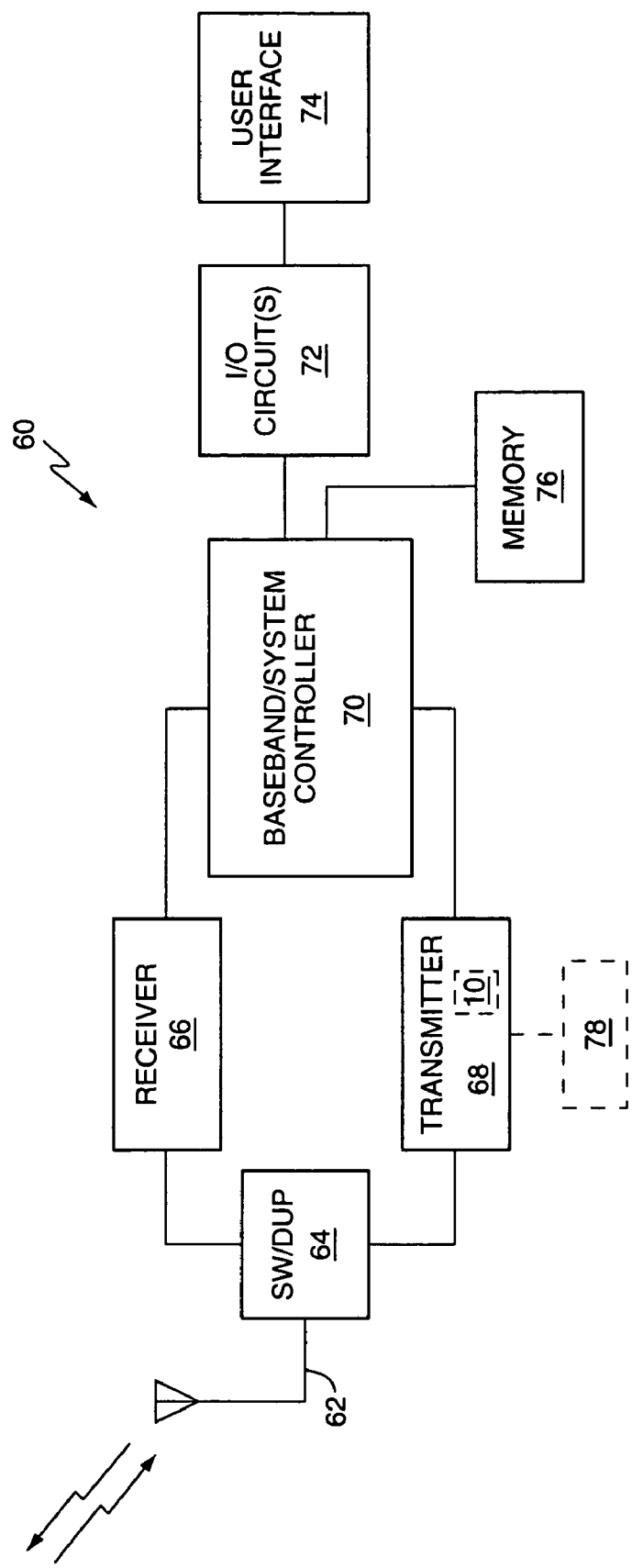
FIG. 9 is a block diagram of a wireless communication device, such as a portable communications handset, wherein the device includes memory or other storage circuits for maintaining divisor values corresponding to different transmit frequencies, such that the transmit frequency of the device is selectable according to a desired transmit frequency band and transmit frequency channel.

More particularly, FIG. 9 illustrates a wireless communication device 60, such as a portable radiotelephone, wireless pager, PDA, computer, etc. that includes an antenna 62, a switch/duplexer 64, a receiver 66, a transmitter 68 (including an embodiment of the transmit circuit 10 previously described), a baseband/system controller 70, one or more input/output circuits 72, and a user interface 74. The wireless communication device 60 may be selectively configured to operate according to a given transmit frequency plan and according to a desired transmit frequency channel selection by selecting one or more pairs of divisor values for the first and second frequency dividers 14 and 16 in conjunction with the selection of the frequency divider 48 used in the first PLL 12.

Supporting such selection, the wireless communication device 60 may include a memory circuit 76 or other storage device for holding a data table including divisor values. Additionally, or alternatively, the transmitter 68 may include, or be associated with, a memory circuit 78 or other storage device that includes the appropriate data tables for configuring the divisor values of the first frequency divider 14 and/or the divisor value of the second frequency divider 16 and/or the divisor values of the frequency divider 48 used in the first PLL 12.

Those skilled in the art will recognize that the ability to vary the divisor values allows the wireless communication device 60 to be adapted to many common frequency bands used for mobile telephony, including the frequency bands commonly used for GSM and EDGE (850 MHz Band, E-GSM Band, DCS Band, and PCS Band) and the 3GPP FDD bands I through VI used for W-CDMA. The methods and apparatus taught herein can be applied to many modulation formats and communication standards, such as GSM, GPRS, EGPRS, W-CDMA, CDMA-2000 and others, because, for example, of their ability to support both phase and amplitude modulation.

Of course, the transmit circuit 10 is not limited to the implementation architecture illustrated in FIG. 9, nor is the broader method of transmit signal generation as taught herein limited to any of the embodiments specifically described and illustrated herein. Indeed, those skilled in the art will recognize that the present invention is not limited by this disclosure or by the accompanying drawings. Rather, the present invention is limited only by the scope of the following claims and their legal equivalents.

What is claimed is:

1. A transmitter circuit comprising:
    a first phase-locked loop configured to generate a first frequency signal that is non-harmonically related to a transmit frequency signal;
    a first frequency divider configured to divide the first frequency signal to generate a mixing frequency signal for downconverting the transmit frequency signal into an intermediate frequency feedback signal;
    a second frequency divider configured to generate an intermediate frequency reference signal by dividing the first frequency signal; and
    a second phase-locked loop configured to generate the transmit frequency signal by phase-locking the intermediate frequency feedback signal to the intermediate frequency reference signal.

2. The transmitter circuit of claim 1, further comprising a quadrature modulator configured to generate a modulated carrier signal by modulating the transmit frequency signal responsive to I/Q modulation signals, and a power amplifier configured to generate an output signal by amplifying the modulated carrier signal.

3. The transmitter circuit of claim 2, wherein the power amplifier is configured to provide linear amplification of the modulated carrier signal.

4. The transmitter circuit of claim 2, wherein the quadrature modulator is configured to generate the modulated carrier signal by imparting desired phase modulations to the transmit frequency signal, and wherein the power amplifier comprises a saturated-mode amplifier circuit configured to generate the output signal by amplifying the modulated carrier signal.

5. The transmitter circuit of claim 4, further comprising an amplitude modulator configured to impart desired amplitude modulations to the output signal by amplitude-modulating a power supply signal of the saturated-mode amplifier circuit.

6. The transmitter circuit of claim 1, further comprising a phase modulator configured to impart desired phase modulations to the transmit frequency signal by phase-modulating one of the first frequency signal, the intermediate frequency feedback signal, or the intermediate frequency reference signal responsive to a phase modulation signal, and a saturated-mode power amplifier configured to generate an output signal by amplifying the transmit frequency signal.

7. The transmitter circuit of claim 6, further comprising an amplitude modulator configured to impart desired amplitude modulations to the output signal by amplitude-modulating a power supply signal of the saturated-mode power amplifier.

8. The transmitter circuit of claim 1, wherein the first phase-locked loop is configured to have a narrow loop bandwidth relative to a transmit frequency channel spacing, and the second phase-locked loop is configured to have a wide loop bandwidth relative to the first phase-locked loop.

9. The transmitter circuit of claim 1, wherein the second phase-locked loop includes a mixer configured to generate the intermediate frequency feedback signal by mixing the transmitter frequency signal and the mixing frequency signal, a phase detector configured to generate an error signal responsive to phase-comparing the intermediate frequency reference signal and the intermediate frequency feedback signal, or a filtered version of the intermediate frequency feedback signal, a loop filter configured to generate a control signal responsive to the error signal, and a Voltage Controlled Oscillator (VCO) configured to generate the transmitter frequency signal responsive to the control signal.

10. The transmitter circuit of claim 1, wherein at least one of the first and second frequency dividers comprise an adjustable frequency divider, allowing the selection of different intermediate frequencies in support of different desired transmit frequencies.

11. The transmitter circuit of claim 1, further comprising a memory circuit included in, or associated with, the transmitter, and storing a data table comprising one or more pairs of divisor values for the first and second frequency dividers, said one or more pairs of divisor values corresponding to one or more desired transmit frequencies in one or more desired transmit frequency bands.

12. The transmitter circuit of claim 1, wherein the transmitter circuit is configured to impart desired phase modulations to the transmit frequency signal in a first mode, and to impart desired phase and amplitude modulations to the transmit frequency signal in a second mode, and further comprising a dual-mode amplifier circuit configured to generate an output signal by providing saturated-mode amplification of the transmit frequency signal in the first mode, and by providing linear-mode amplification of the transmit frequency signal in the second mode.

13. A method of direct-conversion transmission comprising:
    generating a first frequency signal that is non-harmonically related to a transmit frequency signal;
    dividing the first frequency signal to obtain a mixing frequency signal;
    dividing the first frequency signal to obtain an intermediate frequency reference signal; and
    generating the transmit frequency signal by using the mixing frequency signal to downconvert the transmit frequency signal into an intermediate frequency feedback signal and phase-locking the intermediate frequency feedback signal to the intermediate frequency reference signal.

14. The method of claim 13, further comprising generating a modulated carrier signal by modulating the transmit frequency signal responsive to I/Q modulation signals, and generating an output signal by linearly amplifying the modulated carrier signal.

15. The method of claim 13, further imparting desired phase modulations to the transmit frequency signal by phase-modulating one of the first frequency signal, the intermediate frequency feedback signal, or the intermediate frequency reference signal responsive to a phase modulation signal, and generating an output signal by amplifying the transmit frequency signal using a saturated-mode power amplifier.

16. The method of claim 15, further comprising imparting desired amplitude modulations to the output signal by amplitude-modulating a power supply signal of the saturated-mode power amplifier.

17. The method of claim 13, wherein the first frequency signal is generated using a main channel synthesizer, and further comprising configuring the main channel synthesizer to have a narrow loop bandwidth relative to a transmit frequency channel spacing.

18. The method of claim 17, wherein the transmit frequency is generated using a translational phase-locked loop, and further comprising configuring the translational phase-locked loop to have a wide loop bandwidth relative to the main channel synthesizer.

19. The method of claim 13, further comprising varying as needed one or more divisor values used in generating at least one of the mixing frequency signal and the intermediate frequency reference signal to support different desired transmit frequencies.

20. The method of claim 19, further comprising selecting one or more stored divisor values as a function of changing transmit frequencies.

21. A wireless communication device including a transmitter circuit that comprises:

a first phase-locked loop configured to generate a first frequency signal that is non-harmonically related to a transmit frequency signal;

a first frequency divider configured to divide the first frequency signal to generate a mixing frequency signal for downconverting the transmit frequency signal into an intermediate frequency feedback signal;

a second frequency divider configured to generate an intermediate frequency reference signal by dividing the first frequency signal; and a second phase-locked loop configured to generate the transmit frequency signal by phase-locking the intermediate frequency feedback signal to the intermediate frequency reference signal.

* * * * *

UNITED STATES PATENT AND TRADEMARK OFFICE
CERTIFICATE OF CORRECTION

PATENT NO.         : 7,409,192 B2
APPLICATION NO.    : 11/186380
DATED              : August 5, 2008
INVENTOR(S)        : Lombardi et al.

Page 1 of 1

It is certified that error appears in the above-identified patent and that said Letters Patent is hereby corrected as shown below:

On The Title Page Item (75), under "Inventors", Line 1, after "Frank" insert -- Thomas --.

On The Title Page Item (73), under "Assignee", Line 2, after "(publ)" insert -- , Stockholm --.

Signed and Sealed this

Thirty-first Day of March, 2009

JOHN DOLL
*Acting Director of the United States Patent and Trademark Office*